US012648128B1

(12) United States Patent
Cao et al.

(10) Patent No.: US 12,648,128 B1
(45) Date of Patent: Jun. 2, 2026

(54) SEMICONDUCTOR STRUCTURE, METHOD FOR MANUFACTURING SEMICONDUCTOR STRUCTURE, MEMORY AND METHOD FOR MANUFACTURING MEMORY

(71) Applicant: CHANGXIN MEMORY TECHNOLOGIES, INC., Hefei City (CN)

(72) Inventors: Kanyu Cao, Hefei (CN); Tzung-Han Lee, Hefei (CN); Chih-Cheng Liu, Hefei (CN); Huaiwei Yang, Hefei (CN)

(73) Assignee: ChangXin memory Technologies, Inc., Hefei (CN)

( * ) Notice: Subject to any disclaimer, the term of this patent is extended or adjusted under 35 U.S.C. 154(b) by 839 days.

(21) Appl. No.: 17/951,207

(22) Filed: Sep. 23, 2022

Related U.S. Application Data

(63) Continuation of application No. PCT/CN2022/104707, filed on Jul. 8, 2022.

(30) Foreign Application Priority Data

Jun. 24, 2022 (CN) .......................... 202210730103.8

(51) Int. Cl.
*H10B 12/00* (2023.01)
*G11C 5/06* (2006.01)

(52) U.S. Cl.
CPC ............. *H10B 12/33* (2023.02); *G11C 5/063* (2013.01); *H10B 12/036* (2023.02); *H10B 12/05* (2023.02);
(Continued)

(58) Field of Classification Search
CPC ...... H10B 12/33; H10B 12/373; H10B 12/37; H10B 12/482; H10B 12/488; H10B 12/50
See application file for complete search history.

(56) References Cited

U.S. PATENT DOCUMENTS 8,866,208 B2 10/2014 Lee
2020/0328180 A1* 10/2020 Cheng ..................... H01L 25/18
(Continued)

FOREIGN PATENT DOCUMENTS

CN 203774319 U 8/2014
CN 109411473 A 3/2019
(Continued)

OTHER PUBLICATIONS

European Patent Office, the Extended European Search Report Issued in Application No. 22783273.0, Feb. 29, 2024, Germany, 10 pages.
(Continued)

*Primary Examiner* — Joshua Benitez Rosario
*Assistant Examiner* — John Lin
(74) *Attorney, Agent, or Firm* — Intellectual Valley Law, P.C.

(57) ABSTRACT

A semiconductor structure is provided. The semiconductor structure includes: a substrate; a plurality of capacitors arranged in the substrate; and a plurality of active pillars arranged above the substrate. Each of the plurality of active pillars is arranged above a respective one of the plurality of capacitors, and a bottom portion of each of the plurality of active pillars is electrically connected to a top portion of the respective one of the plurality of capacitors therebelow.

8 Claims, 10 Drawing Sheets

(52) U.S. Cl.
     CPC ........... *H10B 12/09* (2023.02); *H10B 12/482*
             (2023.02); *H10B 12/485* (2023.02); *H10B*
             *12/488* (2023.02); *H10B 12/50* (2023.02)

(56)                    References Cited

U.S. PATENT DOCUMENTS

| | | |
|---|---|---|
| 2020/0411528 A1 | 12/2020 | Sung et al. |
| 2021/0066306 A1* | 3/2021 | Tang .................... H10B 12/036 |
| 2021/0202485 A1* | 7/2021 | Inaba ..................... H10B 12/05 |
| 2021/0343717 A1 | 11/2021 | Inaba |
| 2023/0060149 A1* | 3/2023 | Zhu ........................ H10B 12/05 |

FOREIGN PATENT DOCUMENTS

| | | |
|---|---|---|
| CN | 112864158 A | 5/2021 |
| CN | 112909001 A | 6/2021 |
| CN | 113241347 A | 8/2021 |
| CN | 114551450 A | 5/2022 |

OTHER PUBLICATIONS

European Patent Office, Office Action Issued in Application No. 22783273.0, Nov. 29, 2024, Germany, 7 pages.

\* cited by examiner

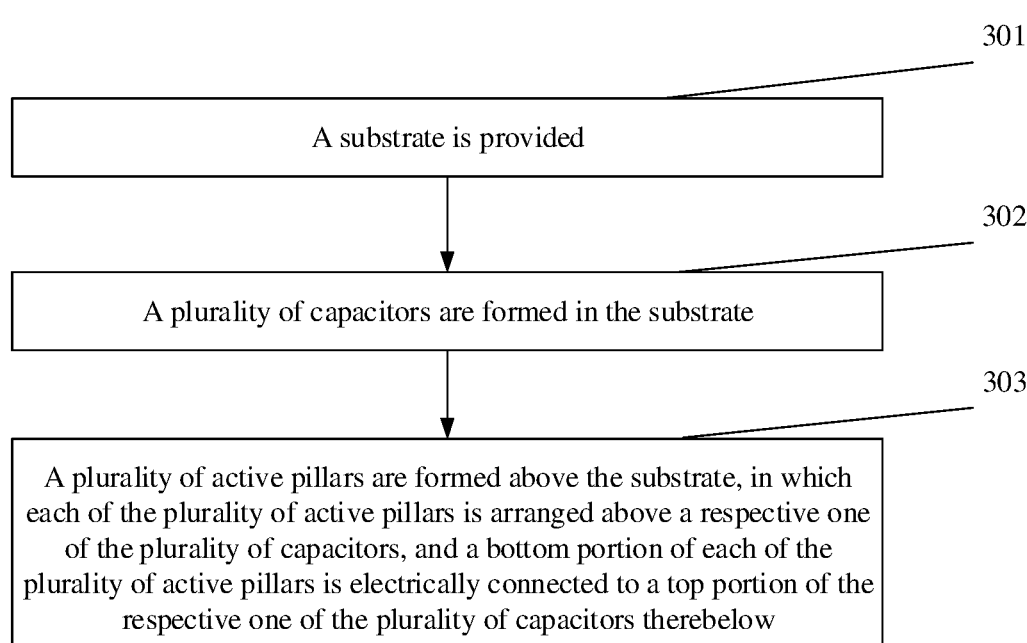

301

A substrate is provided

302

A plurality of capacitors are formed in the substrate

303

A plurality of active pillars are formed above the substrate, in which each of the plurality of active pillars is arranged above a respective one of the plurality of capacitors, and a bottom portion of each of the plurality of active pillars is electrically connected to a top portion of the respective one of the plurality of capacitors therebelow

FIG. 3

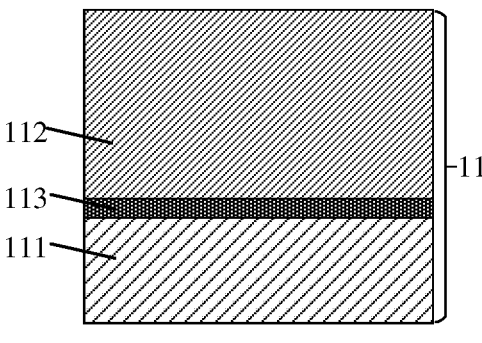

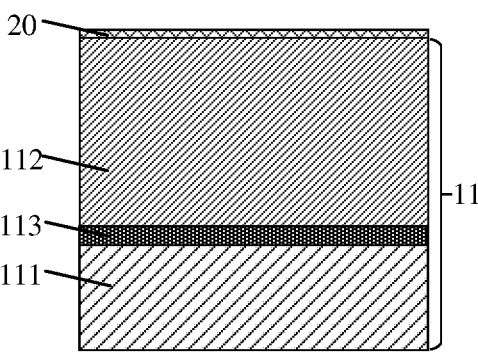

A plurality of first chips are provided, in which each of the plurality of first chips includes a semiconductor structure

602

A wafer is provided, in which the wafer includes a plurality of second chips

603

Each of the plurality of first chips is placed on a respective one of the plurality of second chips, in which an active surface of each of the plurality of first chips is arranged face to face with an active surface of the respective one of the plurality of second chips

604

The active surface of each of the plurality of first chips is bumplessly bonded to the active surface of the respective one of the plurality of second chips

FIG. 6

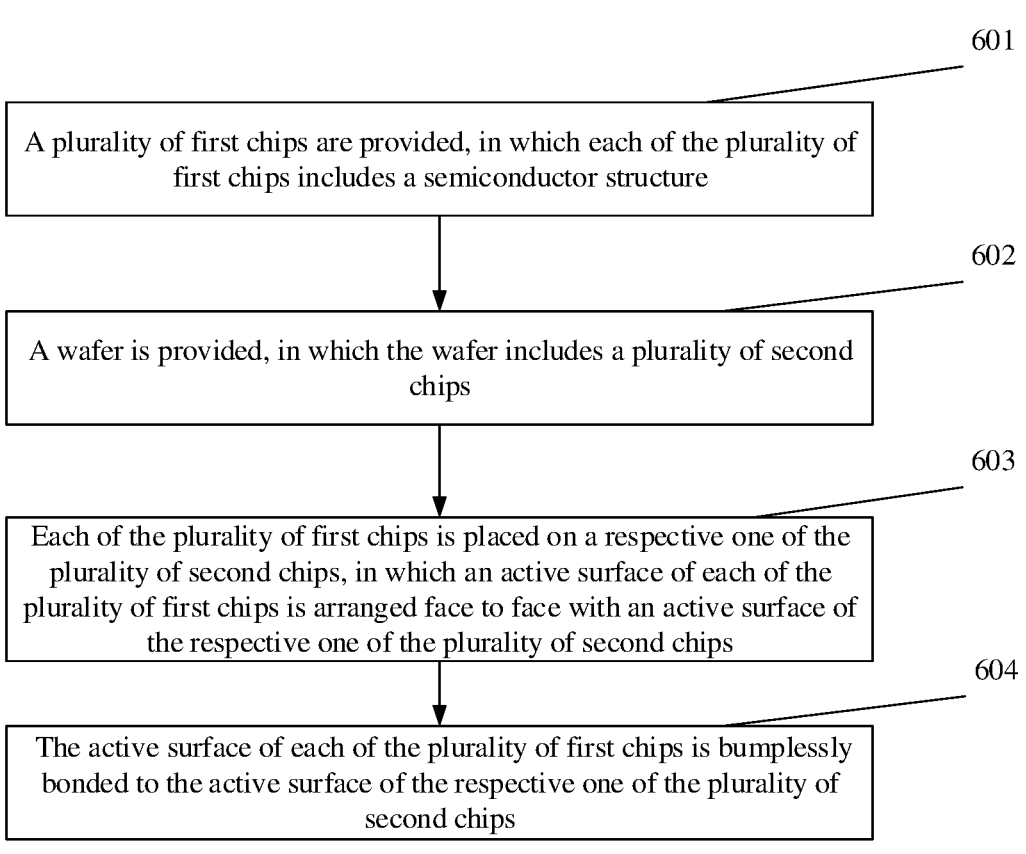

FIG. 7A

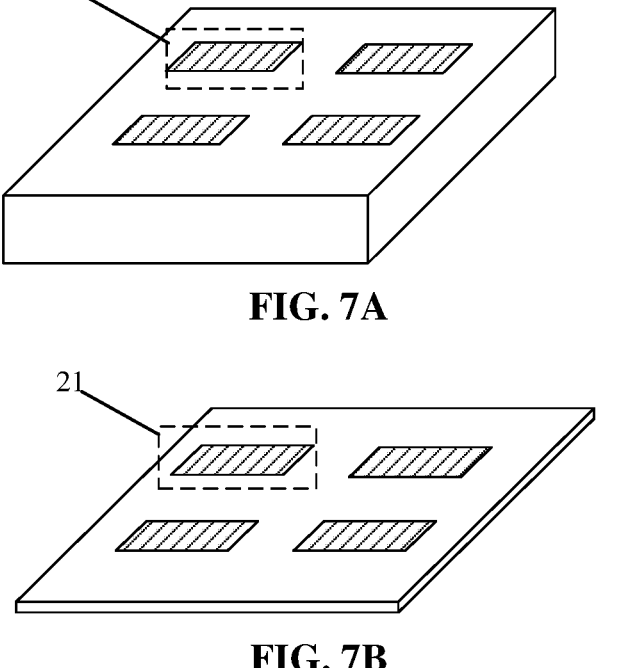

FIG. 7B

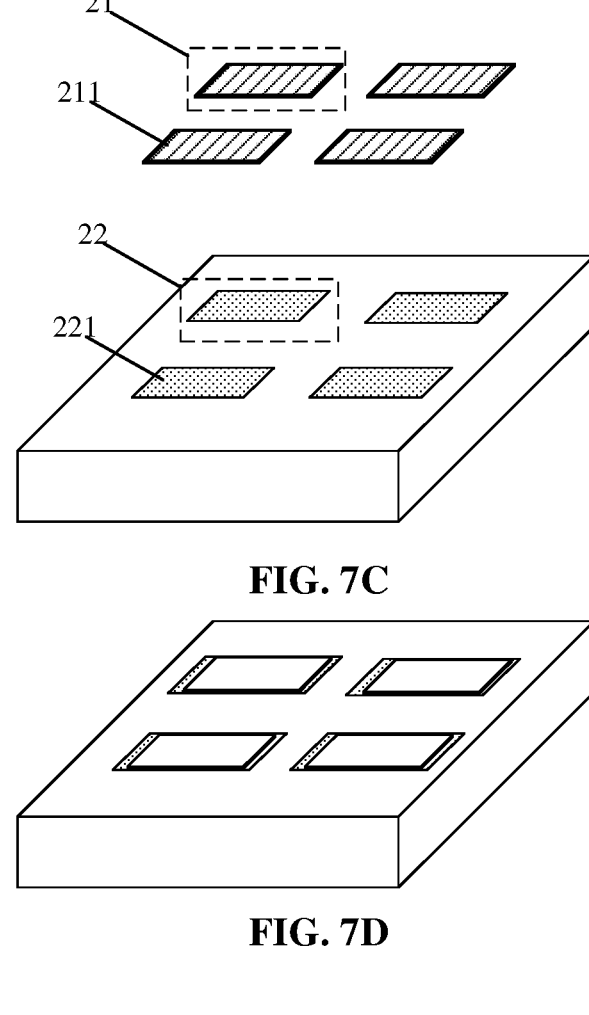
FIG. 7C
FIG. 7D
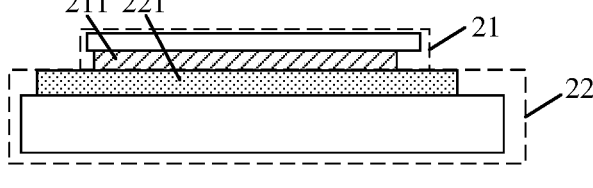
FIG. 7E
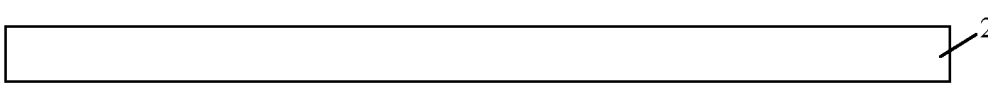
FIG. 7F

SEMICONDUCTOR STRUCTURE, METHOD FOR MANUFACTURING SEMICONDUCTOR STRUCTURE, MEMORY AND METHOD FOR MANUFACTURING MEMORY

CROSS-REFERENCE TO RELATED APPLICATIONS

This is a continuation application of International Patent Application No. PCT/CN2022/104707, filed on Jul. 8, 2022, which claims priority to Chinese Patent Application No. 202210730103.8, filed on Jun. 24, 2022 and entitled "SEMICONDUCTOR STRUCTURE, METHOD FOR MANUFACTURING SEMICONDUCTOR STRUCTURE, MEMORY AND METHOD FOR MANUFACTURING MEMORY". The disclosures of International Patent Application No. PCT/CN2022/104707 and Chinese Patent Application No. 202210730103.8 are incorporated by reference herein in their entireties.

BACKGROUND

A memory (for example, a Dynamic Random Access Memory (DRAM)) usually includes a memory array circuit and a peripheral circuit. The memory array circuit generally consists of a plurality of memory cells arranged in an array. The memory cell generally consists of a transistor and a capacitor. Currently, a process for manufacturing the DRAM is complicated, and a signal interconnection path is long, which limits the storage capacity and integration of the DRAM.

Therefore, how to optimize the structure and process of the DRAM to achieve higher integration has become an urgent problem to be solved.

SUMMARY

The disclosure relates to the technical field of semiconductors, and in particular to a semiconductor structure, a method for manufacturing a semiconductor structure, a memory, and a method for manufacturing a memory.

An embodiment of the disclosure provides a semiconductor structure, which includes: a substrate; a plurality of capacitors arranged in the substrate; and a plurality of active pillars arranged above the substrate. Each of the plurality of active pillars is arranged above a respective one of the plurality of capacitors, and a bottom portion of each of the plurality of active pillars is electrically connected to a top portion of the respective one of the plurality of capacitors therebelow.

An embodiment of the disclosure further provides a method for manufacturing a semiconductor structure, which includes the following operations. A substrate is provided. A plurality of capacitors are formed in the substrate. A plurality of active pillars are formed above the substrate, in which each of the plurality of active pillars is arranged above a respective one of the plurality of capacitors, and a bottom portion of each of the plurality of active pillars is electrically connected to a top portion of the respective one of the plurality of capacitors therebelow.

An embodiment of the disclosure further provides a method for manufacturing a memory, which includes the following operations. A plurality of first chips are provided, in which each of the plurality of first chips includes a semiconductor structure. A wafer is provided, in which the wafer includes a plurality of second chips. Each of the plurality of first chips is placed on a respective one of the plurality of second chips, in which an active surface of each of the plurality of first chips is arranged face to face with an active surface of the respective one of the plurality of second chips. The active surface of each of the plurality of first chips is bumplessly bonded to the active surface of the respective one of the plurality of second chips.

The semiconductor structure includes: a substrate; a plurality of capacitors arranged in the substrate; and a plurality of active pillars arranged above the substrate. Each of the plurality of active pillars is arranged above a respective one of the plurality of capacitors, and a bottom portion of each of the plurality of active pillars is electrically connected to a top portion of the respective one of the plurality of capacitors therebelow.

BRIEF DESCRIPTION OF THE DRAWINGS

In order to describe the technical solutions in the embodiments of the disclosure or conventional technologies more clearly, the accompanying drawings required to be used in the embodiments of the disclosure will be simply introduced below. Apparently, the accompanying drawings in the following description show merely some embodiments of the disclosure, and persons of ordinary skill in the art may still derive other drawings from these accompanying drawings without creative effort.

FIG. 3 is a flowchart of a method for manufacturing a semiconductor structure according to an embodiment of the disclosure;

FIG. 6 is a flowchart of a method for manufacturing a memory according to an embodiment of the disclosure; and FIG. 7A to FIG. 7H are schematic diagrams of a memory during manufacturing according to an embodiment of the disclosure.

REFERENCE NUMERALS

Figure 1:
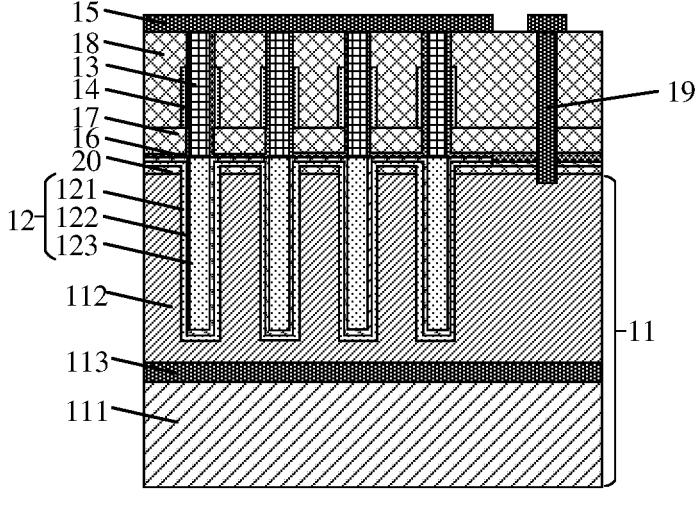
FIG. 1 is a schematic cross-sectional view of a semiconductor structure according to an embodiment of the disclosure.

11—Substrate; 111—Doped area; 112—First semiconductor layer; 113—Insulation layer; 12—Capacitor; 121—Capacitor lower electrode; 122—Capacitor dielectric layer; 123—Capacitor upper electrode; 124—Groove; 13—Active pillar; 131—Second semiconductor layer; 14—Word line; 15—Bit line; 16—Dielectric layer; 17—Lower filling layer; 18—Upper filling layer; 19—Contact; 20—Mask layer; 21—First chip; 211—Active surface of first chip; 22—Second chip; 221—Active surface of second chip; 23—Base plate; 24—Lead wire.

DETAILED DESCRIPTION

Exemplary embodiments disclosed in the disclosure will be described in more detail below with reference to the accompanying drawings. Although the exemplary embodiments of the present disclosure are shown in the accompanying drawings, it should be understood that the present disclosure can be implemented in various forms and cannot be limited by the embodiments illustrated herein. On the contrary, these embodiments are provided to more thoroughly understand the present disclosure and to completely convey the scope of the present disclosure to those skilled in the art.

In the following descriptions, numerous specific details are set forth in order to provide a more thorough understanding of the present disclosure. However, it will be apparent to those skilled in the art that the present disclosure can be implemented without one or more of these details. In other examples, in order to avoid confusion with the present disclosure, some technical features known in the art are not described. That is, all the features of the actual embodiments are not described here, and the well-known functions and structures are not described in detail.

In the accompanying drawings, the sizes and relative size of layers, regions, and elements may be exaggerated for clarity. The same reference numerals denote the same elements throughout the disclosure.

It should be understood that, when an element or layer is described as being "on", "adjacent to", "connected to" or "coupled to" another element or layer, it can be directly on, adjacent to, connected to, or coupled to the other element or layer, or there can be an intermediate element or layer. In contrast, when an element is described as being "directly on", "directly adjacent to", "directly connected to" or "directly coupled to" another element or layer, there is no intermediate element or layer. It should be understood that although the terms "first", "second", "third" and so on may be used to describe various elements, components, regions, layers, and/or portions, these elements, components, regions, layers, and/or portions should not be limited by these terms. These terms are used merely to distinguish an element, component, region, layer, or portion from another element, component, region, layer, or portion. Therefore, a first element, component, region, layer, or portion discussed below may be described as a second element, component, region, layer, or portion without departing from the teachings of the present disclosure. When the second element, component, region, layer or portion is discussed, it does not mean that the first element, component, region, layer or portion is necessarily present in the present disclosure.

Terms used herein are for the purpose of describing specific embodiments only and are not intended to be limiting of the present application. As used herein, "a/an", "one", and "the" in singular forms are also intended to include a plural form unless the context clearly indicates other forms. It should also be understood that the terms "consist" and/or "include" when used in the description, determine presence of the features, integers, steps, operations, elements, and/or components, but do not exclude the presence or addition of one or more other features, integers, steps, operations, elements, components, and/or groups. As used herein, the term "and/or" includes any and all combinations of the related listed items.

Since the cell size of a semiconductor device (for example, Dynamic Random Access Memory (DRAM)) is continuously reduced, the DRAM with a planar transistor layout using a conventional 6F2 architecture design can no longer meet requirements due to the short channel effect. At present, the DRAM with a vertical transistor layout using a 4F2 architecture design has been introduced into the industry. In the DRAM with the vertical transistor layout, a bit line of a vertical transistor is generally arranged at the bottom portion of an active pillar, and a capacitor is arranged above the active pillar. In this structure, bit line signals and word line signals needs to be interconnected with other devices through a plurality of metal lines and contacts, so that the space utilization is low, the signal interconnection paths are complicated, and the packaging performance is poor.

Based on this, an embodiment of the disclosure provides a semiconductor structure. FIG. 1 is a schematic cross-sectional view of a semiconductor structure according to an embodiment of the disclosure.

With reference to FIG. 1, the semiconductor structure includes: a substrate 11; a plurality of capacitors 12 arranged in the substrate 11; and a plurality of active pillars 13 arranged above the substrate 11. Each of the plurality of active pillars 13 is arranged above a respective one of the plurality of capacitors 12, and a bottom portion of each of the plurality of active pillars 13 is electrically connected to a top portion of the respective one of the plurality of capacitors 12 therebelow.

In the embodiments of the disclosure, each active pillar is arranged above the respective capacitor. That is to say, a transistor is arranged above the capacitor. In this way, the bit line electrically connected to the active pillar may be directly formed on the top portion of the active pillar, without the need for additional manufacture a contact and an interconnection line to lead out a bit line signal, so that the process is simplified. Further, since the bit line is directly formed on the top portion of the active pillar, that is, the bit line is formed on an active surface of a memory array chip, so that a Chip On Wafer (COW) process may be conveniently used later. With less interconnection lines and contacts, the memory array chip and the peripheral circuit wafer can be directly and bumplessly connected to each other in a vertical direction in a face-to-face manner. In this way, the space utilization is effectively improved, and the signal interconnection paths are reduced, thereby reducing the thermal resistance, and improving the signal transmission speed.

The substrate 11 may be a semiconductor substrate, and may include at least one elementary semiconductor material (for example, a silicon (Si) substrate, a germanium (Ge) substrate), at least one III-V compound semiconductor material, at least one II-VI compound semiconductor material, at least one organic semiconductor material, or other semiconductor materials known in the art. In a specific embodiment, the substrate is a silicon substrate. The silicon substrate may be doped or undoped. In some other embodiments, the substrate 11 includes a doped area 111 and a first semiconductor layer 112 arranged above the doped area. The capacitors 12 are arranged in the first semiconductor layer 112. The doped area 111 may be, for example, a Deep N-Well (DNW). The first semiconductor layer 112 includes, but is not limited to, silicon germanium. In some more specific embodiments, the substrate 11 further includes an insulation layer 113. The insulation layer is arranged between the doped area 111 and the first semiconductor layer 112. In the actual operation, the substrate may be a wafer.

In some embodiments, with reference to FIG. 1, the semiconductor structure further includes a plurality of word lines 14 extending in a first direction and a plurality of bit lines 15 extending in a second direction which intersects with the first direction. The plurality of word lines 14 are arranged above the substrate 11, and each of the plurality of word lines 14 is arranged around a sidewall of a respective one of the plurality of active pillars 13. The plurality of bit lines 15 are arranged above the plurality of active pillars 13, and a bottom portion of each of the plurality of bit lines 15 is electrically connected to top portions of the plurality of active pillars 13. In this way, the bit lines are directly formed on the top portions of the active pillars, so that the number of the interconnection lines and the contacts is greatly reduced, thereby improving the space utilization, and shortening the signal transmission distance. Herein, a material of the word line 14 may include a conductive material. The conductive material includes, but is not limited to, tungsten (W), copper (Cu), titanium (Ti), tantalum (Ta), titanium nitride (TiN), tantalum nitride (TaN), polycrystalline silicon, doped silicon, metal silicide, metal alloys, or any combination thereof. In other embodiments, a connection member may further be provided between the bit line 15 and the active pillar 13. The bit line 15 is electrically connected to the active pillar 13 through the connection member, thereby reducing the contact resistance between the bit line 15 and the active pillar 13. In the actual operation, the bit line 15 may include a heavily doped area. A material of the bit line 15 may include a conductive material. The conductive material includes, but is not limited to, tungsten (W), copper (Cu), titanium (Ti), tantalum (Ta), titanium nitride (TiN), tantalum nitride (TaN), polycrystalline silicon, doped silicon, metal silicide, metal alloys, or any combination thereof.

In some embodiments, the area of the active pillar 13 which is surrounded by the word line 14 includes a channel doped area. Each of an upper portion and a lower portion of the active pillar 13 which is not surrounded by the word line 14 includes a source/drain doped area. Each of the upper portion and the lower portion of the active pillar is configured as a source or a drain of a vertical transistor. A doping type of the channel doped area is opposite to a doping type of the source/drain doped area.

In some embodiments, with reference to FIG. 1, the semiconductor structure further includes: a dielectric layer 16 arranged above the substrate 11 and covering the sidewalls of the plurality of active pillars 13; a lower filling layer 17 filled in gaps between any two adjacent active pillars 13 of the plurality of active pillars below the plurality of word lines 14; and an upper filling layer 18 filled in gaps between any two adjacent word lines 14 of the plurality of word lines and gaps between any two adjacent active pillars 13 of the plurality of active pillars above the plurality of word lines 14. A material of the dielectric layer includes, but is not limited to, oxide, for example, may be silicon oxide. A process of forming the dielectric layer 16 includes, but is not limited to, an atomic layer deposition process or a thermal oxidation process. In the actual operation, the atomic layer deposition process may be used to form the dielectric layer with a uniform thickness and a dense structure on the sidewalls of the active pillars. Materials of the lower filling layer 17 and the upper filling layer 18 include, but are not limited to, silicon oxide, silicon nitride, silicon oxynitride or polymeric materials. In some embodiments, the materials of the upper filling layer and the lower filling layer may be the same. The upper filling layer and the lower filling layer may be formed through one or more thin film deposition processes, such as an Atomic Layer Deposition (ALD) process, a Chemical Vapor Deposition (CVD) process, etc.

In some embodiments, with reference to FIG. 1, the semiconductor structure further includes a mask layer 20. The mask layer 20 at least covers an upper surface of the substrate 11, and is configured to protect the top portion of the substrate 11 from being oxidized, nitrided, damaged or contaminated in subsequent processes. A material of the mask layer 20 includes, but is not limited to, nitride, for example, may be silicon nitride. Herein, the materials of the mask layer, the upper filling layer and the lower filling layer may be the same.

In some embodiments, with reference to FIG. 1, the semiconductor structure further includes a contact 19. The contact 19 penetrates through the upper filling layer 18 and the lower filling layer 17. A bottom portion of the contact 19 is electrically connected to the plurality of capacitors 12. A material of the contact may include a conductive material. The conductive material includes, but is not limited to, tungsten (W), copper (Cu), titanium (Ti), tantalum (Ta), titanium nitride (TiN), tantalum nitride (TaN), polycrystalline silicon, doped silicon, metal silicide, metal alloys, or any combination thereof. In some embodiments, the materials of the contact 19 and the bit line 15 may be the same. In the actual operation, the contact may be arranged on a side of an array area of the active pillar, which is not limited thereto. The contact may also be arranged in the array area of the active pillar, and arranged between two adjacent word lines, and penetrate through the upper filling layer 18 and the lower filling layer 17 between the adjacent word lines.

In some embodiments, with reference to FIG. 1, the capacitor 12 includes a capacitor upper electrode 123, a capacitor dielectric layer 122 and a capacitor lower electrode 121. The capacitor dielectric layer 122 is arranged between the capacitor upper electrode 123 and the capacitor lower electrode 121. A bottom portion of the contact 19 is electrically connected to the capacitor lower electrode 121. The bottom portion of the active pillar 13 is electrically connected to the capacitor upper electrode 123. Materials of the capacitor upper electrode 123 and the capacitor lower electrode 121 may include a conductive material. The conductive material includes, but is not limited to, tungsten (W), copper (Cu), titanium (Ti), tantalum (Ta), titanium nitride (TiN), tantalum nitride (TaN), polycrystalline silicon, doped silicon, metal silicide, metal alloys, or any combination thereof. In some embodiments, the materials of the capacitor upper electrode 123 and the capacitor lower electrode 121 may be the same. A material of the capacitor dielectric layer 122 may be, for example, a High k material.

In some embodiments, a material of the active pillar 13 includes Indium Gallium Zinc Oxide (IGZO). In the embodiments of the disclosure, since the transistor is formed above the capacitor, a manufacturing process of forming the active pillar by using a conventional semiconductor material (for example, silicon) is complicated. The IGZO has the advantages of high mobility, simple manufacturing process, good uniformity, transparency, and low power consumption. Herein, the IGZO refers to an oxide containing In, Ga and Zn as main components, and may also contain metal elements other than In, Ga, and Zn. For example, the IGZO may also contain one or more of tin (Sn), hafnium (Hf), zirconium (Zr), titanium (Ti), scandium (Sc), yttrium (Y), or lanthanides (such as cerium (Ce), neodymium (Nd), gadolinium (Gd)). It should be understood that, the ratio of In, Ga, and Zn is not limited. Exemplarily, the ratio of In, Ga, and Zn may be 1:1:1, or the ratio of In, Ga, and Zn may be 3:1:2, or the ratio of In, Ga, and Zn may be 2:3:1. In the actual operation, the IGZO may be formed by PVD magnetron sputtering from targets such as indium, gallium, zinc, oxygen, etc. Herein, the upper portion and the lower portion of the active pillar 13 which are not surrounded by the word line 14 may form the source/drain doped area through an in-situ doping process. Exemplarily, the source/drain doped area may be formed by correspondingly injecting an N-type element (for example, arsenic (As) element or phosphorus (P) element), so as to finally form an N-type transistor. It should be understood that, the material of the active pillar may also be other III-V semiconductor materials or oxide semiconductor materials.

Figure 2A:
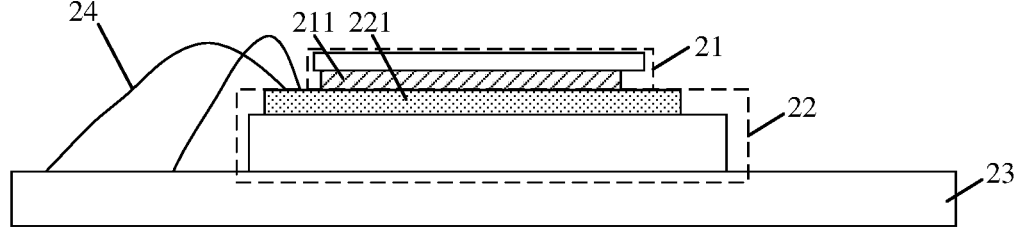
FIG. 2A is a schematic vertical cross-sectional view of a memory according to an embodiment of the disclosure.
Figure 2B:
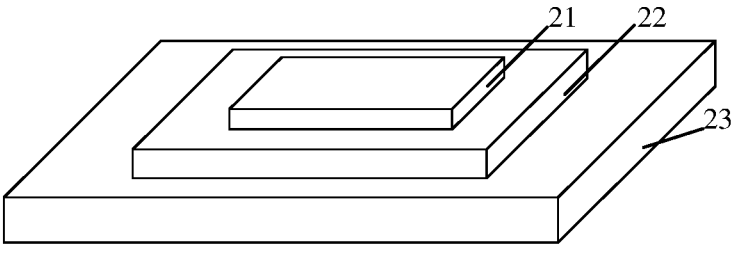
FIG. 2B is a schematic three-dimensional diagram of a memory according to an embodiment of the disclosure.

An embodiment of the disclosure provides a memory. FIG. 2A is a schematic vertical cross-sectional view of a memory according to an embodiment of the disclosure. FIG. 2B is a schematic three-dimensional diagram of a memory according to an embodiment of the disclosure.

With reference to FIG. 2A and FIG. 2B, the memory includes: a first chip 21 including the semiconductor structure described in any one of the above embodiments; and a second chip 22 including a peripheral circuit. An active surface 211 of the first chip is bumplessly bonded to an active surface 221 of the second chip. Herein, the first chip 21 may be a memory array chip. The second chip 22 may be a periphery chip. Herein, the memory array chip includes a memory cell array. The periphery chip includes a peripheral circuit. The peripheral circuit may include any appropriate digital, analog and/or mixed-signal circuits that are used to facilitate the operation of the memory cell array. For example, the periphery circuit may include one or more of a page buffer, a decoder (for example, a row decoder or a column decoder), a sense amplifier, a driver (for example, a word line driver), a charge pump, current or voltage references, or any active or passive component (for example, a transistor, a diode, a resistor or a capacitor) of the circuit. The first chip and the second chip may further include circuit assemblies. The circuit assemblies may include, but are not limited to, transistors, resistors, capacitors and interconnection members, so as to form an IC integrated circuit. Bumpless bonding may be, for example, hybrid bonding. Since the transistor of the memory array chip is arranged above the capacitor, the bit line may be directly formed on the active surface. In this way, with less interconnection lines and contacts, the memory array chip and the periphery chip can be directly and bumplessly connected to each other in the vertical direction in a face-to-face manner. In this way, the space utilization is effectively improved, and the signal interconnection paths are reduced, thereby reducing the thermal resistance, and improving the signal transmission speed.

In some embodiments, with reference to FIG. 2A and FIG. 2B, the second chip 22 is arranged below the first chip 21. A projection of the second chip 22 in a vertical direction covers a projection of the first chip 21 in the vertical direction, so as to reserve the space for the interconnection between the first chip 21 and the second chip 22 which are bonded to each other and other devices. An end of the interconnection member may be arranged in a position where the projection of the second chip 22 in the vertical direction does not overlap with the projection of the first chip 21 in the vertical direction.

In some embodiments, with reference to FIG. 2A and FIG. 2B, the semiconductor structure further includes a base plate 23. The base plate 23 is arranged below the second chip 22. A projection of the base plate 23 in the vertical direction covers the projection of the second chip 22 in the vertical direction. The base plate 23 is bonded to the second chip 22 through a lead wire 24. The lead wire includes, but is not limited to, a gold wire, a copper wire, an aluminum wire, or a combination thereof. The base plate may be a Printed Circuit Board (PCB). Herein, one end of the lead wire may be arranged on the active surface of the second chip 22, and the other end of the lead wire may be arranged in a position where the projection of the base plate 23 in the vertical direction does not overlap with the projection of the second chip 22 in the vertical direction. In this way, electric interconnection and information communication between the first chip 21, the second chip 22 and the base plate can be achieved by bonding through the lead wire. The lead wire bonding process has the advantages of simple manufacturing process, low cost, low bonding temperature, high bonding strength and high efficiency.

An embodiment of the disclosure further provides a method for manufacturing a semiconductor structure. With reference to FIG. 3, the manufacturing method includes the following operations.

In S301, a substrate is provided.

In S302, a plurality of capacitors are formed in the substrate.

In S303, a plurality of active pillars are formed above the substrate, in which each of the plurality of active pillars is arranged above a respective one of the plurality of capacitors, and a bottom portion of each of the plurality of active pillars is electrically connected to a top portion of the respective one of the plurality of capacitors therebelow.

Specific implementations of the disclosure are described in detail below with reference to FIG. 4A to FIG. 4O. FIG. 4A to FIG. 4O are schematic diagrams of a semiconductor structure during manufacturing according to an embodiment of the disclosure. For convenience of description, a schematic diagram may be partially enlarged not according to a general scale, and the schematic diagram is only an example, and should not limit the protection scope of the disclosure herein.

The method begins at S301. As shown in FIG. 4A, the substrate 11 is provided. The substrate 11 may be a semiconductor substrate, and may include at least one elementary semiconductor material (for example, a silicon (Si) substrate, or a germanium (Ge) substrate), at least one III-V compound semiconductor material, at least one II-VI compound semiconductor material, at least one organic semiconductor material, or other semiconductor materials known in the art. In a specific embodiment, the substrate is a silicon substrate. The silicon substrate may be doped or undoped. In some other embodiments, the substrate 11 includes a doped area 111 and a first semiconductor layer 112 arranged above the doped area. The doped area 111 may be, for example, a Deep N-Well (DNW). The first semiconductor layer 112 includes, but is not limited to, silicon germanium. In some more specific embodiments, the substrate 11 further includes an insulation layer 113. The insulation layer is arranged between the doped area 111 and the first semiconductor layer 112. In the actual operation, the substrate may be a wafer.

Next, as shown in FIG. 4B to FIG. 4E, S102 is performed, in which a plurality of capacitors 12 are formed in the substrate 11.

In some embodiments, with reference to FIG. 4B to FIG. 4E, the operation that the plurality of capacitors 12 are formed includes the following operations. A mask layer 20 is deposited above the substrate 11. The mask layer 20 and the substrate 11 are patterned to form a plurality of grooves 124. A capacitor lower electrode 121, a capacitor dielectric layer 122 and a capacitor upper electrode 123 are sequentially formed in each of the plurality of grooves 124.

Specifically, as shown in FIG. 4B, the mask layer 20 is firstly deposited above the substrate 11. A material of the mask layer 20 includes, but is not limited to, nitride, for example, may be silicon nitride.

Figure 4C:
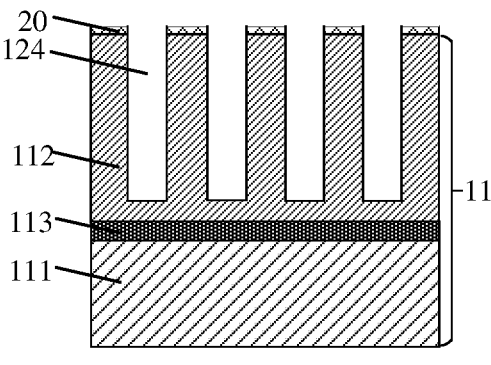
FIG. 4A to FIG. 4O are schematic diagrams of a semiconductor structure during manufacturing according to an embodiment of the disclosure.
Figure 4D:
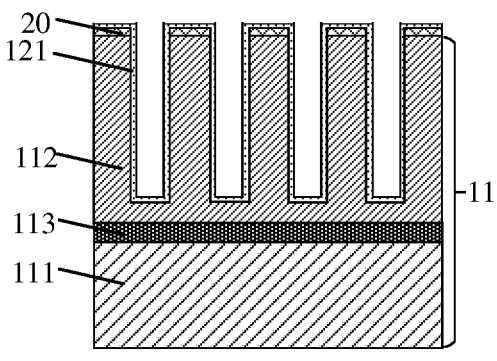

Next, with reference to FIG. 4C, the mask layer 20 and the substrate 11 are patterned to form the plurality of grooves 124. The patterning process may be, for example, a dry etching process, so that the grooves with better morphology and higher size accuracy can be formed. The mask layer 20 is configured to protect the top portion of the substrate 11 from being oxidized, nitrided, damaged, or contaminated in subsequent processes.

Figure 4E:
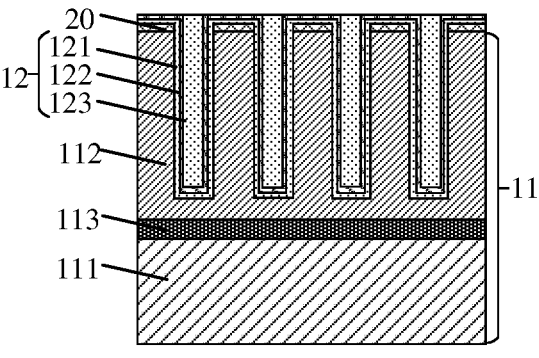

Then, as shown in FIG. 4B and FIG. 4E, the capacitor lower electrode 121, the capacitor dielectric layer 122 and the capacitor upper electrode 123 are sequentially formed in each groove 124. Materials of the capacitor upper electrode 123 and the capacitor lower electrode 121 may include a conductive material. The conductive material includes, but is not limited to, tungsten (W), copper (Cu), titanium (Ti), tantalum (Ta), titanium nitride (TiN), tantalum nitride (TaN), polycrystalline silicon, doped silicon, metal silicide, metal alloys, or any combination thereof. In some embodiments, the materials of the capacitor upper electrode 123 and the capacitor lower electrode 121 may be the same. A material of the capacitor dielectric layer 122 may be, for example, a High k material.

Figure 4F:
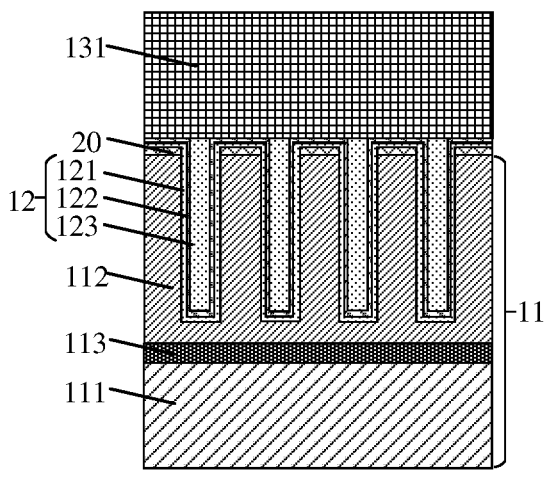
Figure 4G:
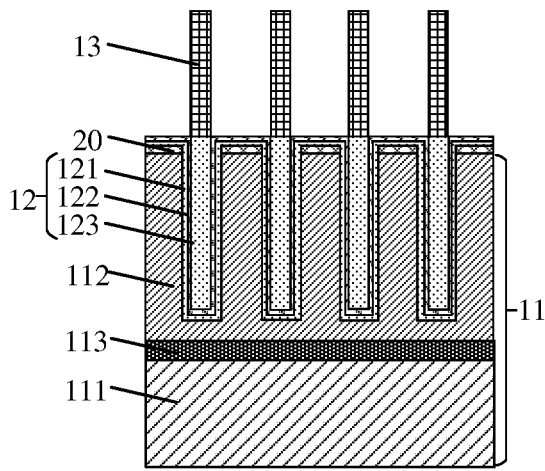

Finally, with reference to FIG. 4F and FIG. 4G, S103 is performed, in which a plurality of active pillars 13 are formed above the substrate 11. Each of the plurality of active pillars 13 is arranged above a respective one of the plurality of capacitors 12. A bottom portion of each of the plurality of active pillar 13 is electrically connected to a top portion of the respective one of the plurality of capacitors 12 therebelow.

In some embodiments, the operation that the plurality of active pillars 13 are formed includes the following operations. A second semiconductor layer 131 is deposited above the plurality of capacitors. The second semiconductor layer 131 is patterned to form the plurality of active pillars 13. Each of the plurality of active pillars 13 is arranged above a respective one of the plurality of capacitors 12.

Specifically, with reference to FIG. 4F, the second semiconductor layer 131 is firstly deposited above the capacitors. In the actual operation, a material of the second semiconductor layer 131 includes Indium Gallium Zinc Oxide (IGZO). In the embodiments of the disclosure, since the transistor is formed above the capacitor, a manufacturing process of forming the active pillar by using a conventional semiconductor material (for example, silicon) is complicated. The IGZO has the advantages of high mobility, simple manufacturing process, good uniformity, transparency, and low power consumption. Herein, the IGZO refers to an oxide containing In, Ga and Zn as main components, or may also contain metal elements other than In, Ga, and Zn. For example, the IGZO may also contain one or more of tin (Sn), hafnium (Hf), zirconium (Zr), titanium (Ti), scandium (Sc), yttrium (Y), or lanthanides (such as cerium (Ce), neodymium (Nd), gadolinium (Gd)). It should be understood that, the ratio of In, Ga, and Zn is not limited. Exemplarily, the ratio of In, Ga, and Zn may be 1:1:1, or the ratio of In, Ga, and Zn may be 3:1:2, or the ratio of In, Ga, and Zn may be 2:3:1. In the actual operation, the IGZO may be formed by PVD magnetron sputtering from targets such as indium, gallium, zinc, oxygen, etc.

Next, as shown in FIG. 4G, the second semiconductor layer 131 is patterned to form the plurality of active pillars 13. Each of the plurality of active pillars 13 is arranged above a respective one of the plurality of capacitors 12. The patterning process may be, for example, a dry etching process, so as to form the active pillar with better morphology and higher size accuracy. In the actual operation, the bottom portion of the active pillar 13 may be electrically connected to the capacitor upper electrode 123.

In some embodiments, with reference to FIG. 4H to FIG. 4N, after the plurality of active pillars 13 are formed, the method further includes the following operations. A plurality of word lines 14 extending in a first direction are formed, in which the plurality of word lines 14 are arranged above the substrate 11, and each of the plurality of word lines 14 is arranged around a sidewall of a respective one of the plurality of active pillars 13. A plurality of bit lines 15 extending in a second direction which intersects with the first direction are formed, in which the plurality of bit lines 15 are arranged above the plurality of active pillars 13, and a bottom portion of each of the plurality of bit lines 15 is electrically connected to top portions of the plurality of active pillars 13.

In some embodiments, with reference to FIG. 4H to FIG. 4M, the operation that the plurality of word lines 14 are formed includes the following operations. A dielectric layer 16 is formed, in which the dielectric layer 16 covers the plurality of active pillars 13. A lower filling layer 17 is formed, in which the lower filling layer 17 is partially filled in gaps between any two adjacent active pillars 13 of the plurality of active pillars, and exposes a channel area in each of the plurality of active pillars 13. A word line material layer 141 is formed on the lower filling layer 17, and the word line material layer 141 is etched in the first direction to form the plurality of word lines 14 extending in the first direction, in which each of the plurality of word lines is arranged around the channel area in a respective one of plurality of active pillars. An upper filling layer 18 is formed. Planarization is performed to remove the dielectric layer 16 covering the top portions of the plurality of active pillars 13 and to remove the upper filling layer 18 covering the top portions of the plurality of active pillars 13, so as to allow a surface of the upper filling layer 18 to be flush with a surface of each of the plurality of active pillars 13.

Figure 4H:
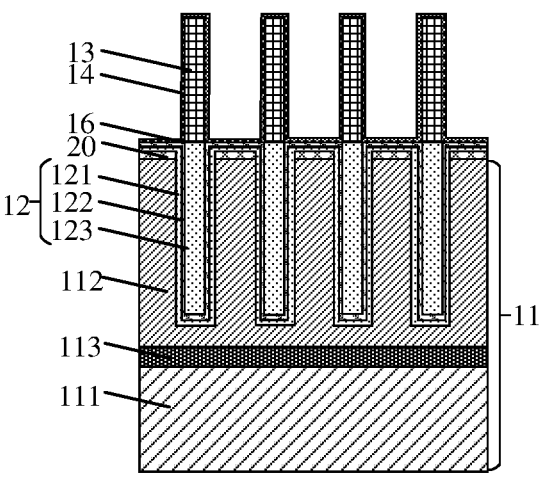

Specifically, with reference to FIG. 4H, the dielectric layer 16 is firstly formed. The dielectric layer 16 covers the active pillars 13. A material of the dielectric layer includes, but is not limited to, oxide, for example, may be silicon oxide. A process of forming the dielectric layer 16 includes, but is not limited to, an atomic layer deposition process or a thermal oxidation process. In the actual operation, the atomic layer deposition process may be used to form the dielectric layer with a uniform thickness and dense structure on the sidewalls of the active pillars.

Figure 4I:
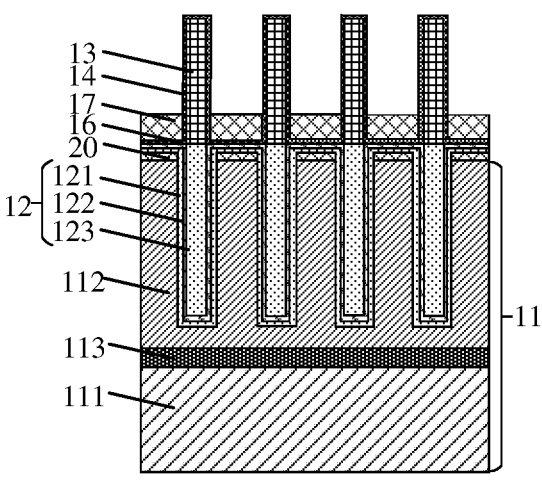

Next, as shown in FIG. 4I, the lower filling layer 17 is formed. The lower filling layer 17 is partially filled in gaps between any two adjacent active pillars 13, and exposes the channel area in the active pillar 13. The material of the lower filling layer 17 includes, but is not limited to, silicon oxide, silicon nitride, silicon oxynitride or polymeric materials. The lower filling layer may be formed through one or more thin film deposition processes, such as an ALD process, a CVD process, etc.

Figure 4J:
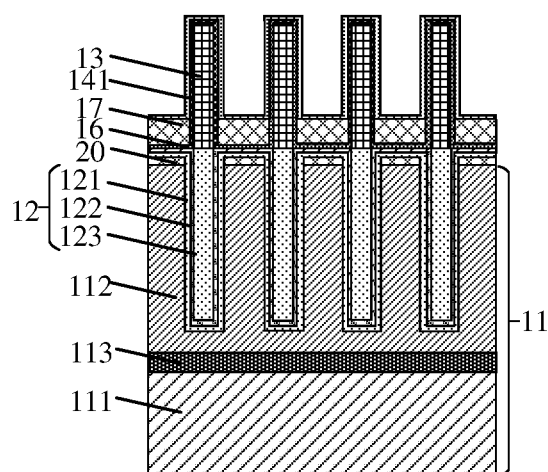
Figure 4K:
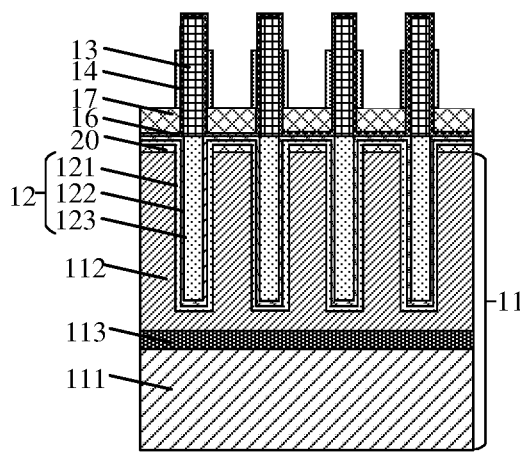

Next, as shown in FIG. 4J and FIG. 4K, the word line material layer 141 is formed on the lower filling layer 17, and the word line material layer 141 is etched in the first direction to form the plurality of word lines 14 extending in the first direction. The word line is arranged around the channel area in the active pillar. The material of the word line 14 may include a conductive material. The conductive material includes, but is not limited to, tungsten (W), copper (Cu), titanium (Ti), tantalum (Ta), titanium nitride (TiN), tantalum nitride (TaN), polycrystalline silicon, doped silicon, metal silicide, metal alloys, or any combination thereof.

Figure 4L:
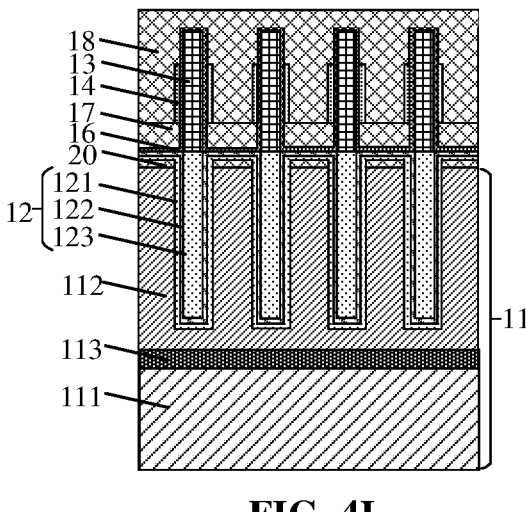

Then, as shown in FIG. 4L, the upper filling layer 18 is formed. The material of the upper filling layer 18 includes, but is not limited to, silicon oxide, silicon nitride, silicon oxynitride or polymeric materials. The upper filling layer may be formed through one or more thin film deposition processes, such as an ALD process, a CVD process, etc. In some embodiments, the materials of the upper filling layer and the lower filling layer may be the same.

Figure 4M:
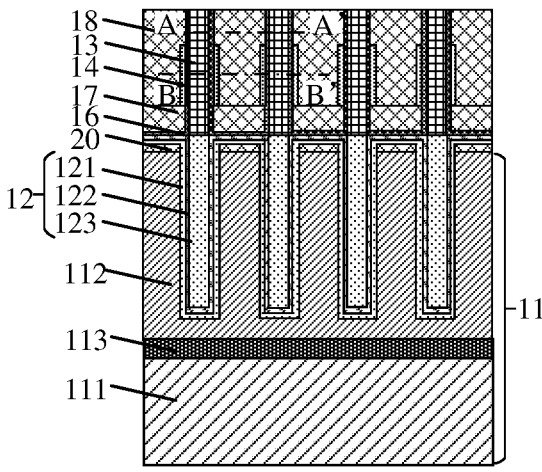
Figure 5A:
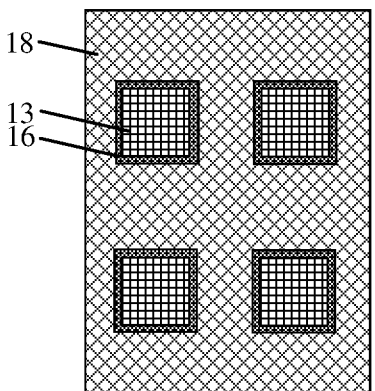
FIG. 5A is a cross-sectional view taken along a dotted line AA' in FIG. 4M.
Figure 5B:
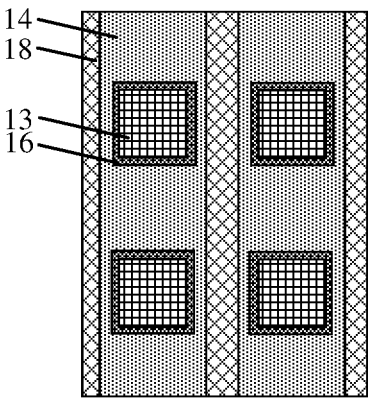
FIG. 5B is a cross-sectional view taken along a dotted line BB' in FIG. 4M.

Next, as shown in FIG. 4M, planarization is performed, so as to remove the dielectric layer 16 and the upper filling layer 18 which cover the top portions of the active pillars 13, so that the surface of the upper filling layer 18 is flush with the surface of each active pillar 13. As shown in FIG. 5A and FIG. 5B, the upper filling layer is filled in the gaps between any two adjacent word lines and between any two adjacent active pillars above the word lines. The planarization process includes, but is not limited to, chemical mechanical polishing, etching planarization, or a combination thereof.

Figure 4N:
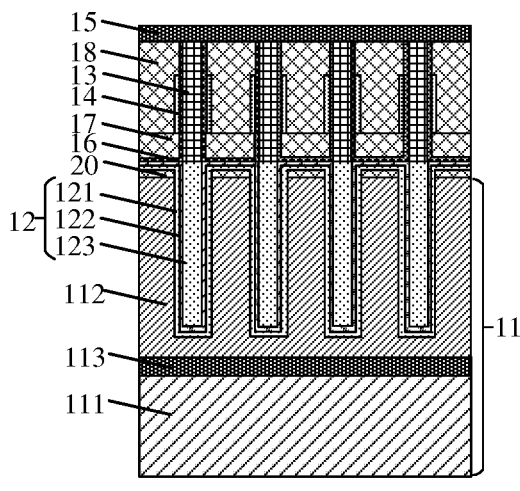
Figure 4O:
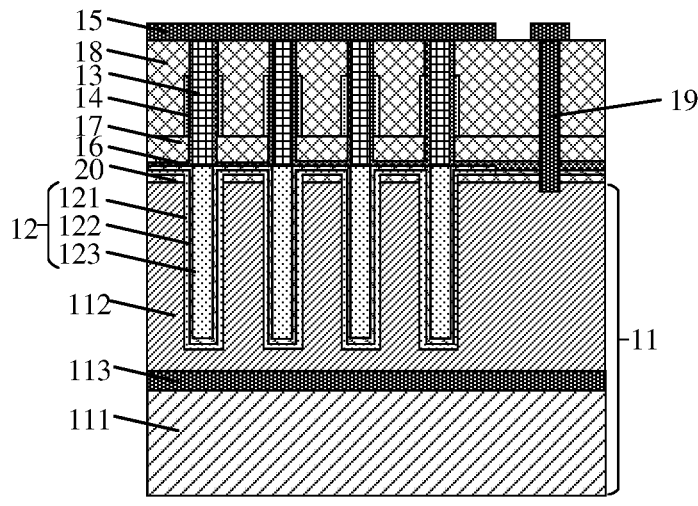

Finally, with reference to FIG. 4N, the plurality of bit lines 15 extending in a second direction which intersects with the first direction are formed. The bit lines 15 are arranged above the active pillars 13, and a bottom portion of each bit line 15 is electrically connected to top portions of the active pillars 13. In other embodiments, a connection member may further be provided between the bit line 15 and the active pillar 13. The bit line 15 is electrically connected to the active pillar 13 through the connection member, so that the contact resistance between the bit line 15 and the active pillar 13 can be reduced. In the actual operation, the bit line 15 may include a heavily doped area. Herein, a material of the bit line 15 may include a conductive material. The conductive material includes, but is not limited to, tungsten (W), copper (Cu), titanium (Ti), tantalum (Ta), titanium nitride (TiN), tantalum nitride (TaN), polycrystal-line silicon, doped silicon, metal silicide, metal alloys, or any combination thereof.

In some embodiments, with reference to FIG. 4O, before the plurality of bit lines 15 are formed, the method further includes the following operation. A contact 19 is formed. A bottom portion of the contact 19 is electrically connected to the plurality of capacitors 12. In the actual operation, the contact 19 penetrates through the upper filling layer 18 and the lower filling layer 17. The bottom portion of the contact 19 is electrically connected to the capacitor lower electrode 121. A material of the contact may include a conductive material. The conductive material includes, but is not limited to, tungsten (W), copper (Cu), titanium (Ti), tantalum (Ta), titanium nitride (TiN), tantalum nitride (TaN), polycrystal-line silicon, doped silicon, metal silicide, metal alloys, or any combination thereof. In other embodiments, the contact may also be formed after the bit lines are formed. In the actual operation, the contact may be arranged on a side of an array area of the active pillar, which is not limited thereto. The contact may also be arranged in the array area of the active pillar, and arranged between the adjacent word lines, and penetrates through the upper filling layer 18 and the lower filling layer 17 between the adjacent word lines.

In some embodiments, the materials of the contact 19 and the bit line 15 may be the same. Specifically, a contact trench is firstly formed. Then, a conductive material is deposited. The conductive material covers the surfaces of the active pillars and is filled in the contact trench. The conductive material filled in the contact trench forms the contact. Finally, the conductive material covering the surfaces of the active pillars is etched, so as to form the plurality of bit lines 15 extending in the second direction which intersects with the first direction. The bit lines 15 are arranged above the active pillars 13, and the bottom portion of the bit line 15 is electrically connected to the top portions of the active pillars 13.

An embodiment of the disclosure further provides a method for manufacturing a memory. With reference to FIG. 6, the manufacturing method includes the following operations.

In S601, a plurality of first chips are provided, in which each of the plurality of first chips includes the semiconductor structure described in any one of the above embodiments.

In S602, a wafer is provided, in which the wafer includes a plurality of second chips.

In S603, each of the plurality of first chips is placed on a respective one of the plurality of second chips, in which an active surface of each of the plurality of first chips is arranged face to face with an active surface of the respective one of the plurality of second chips.

In S604, the active surface of each of the plurality of first chips is bumplessly bonded to the active surface of the respective one of the plurality of second chips.

Specific implementations of the disclosure are described in detail below with reference to FIG. 7A to FIG. 7H. FIG. 7A to FIG. 7H are schematic diagrams of a memory during manufacturing according to an embodiment of the disclosure. For convenience of description, a schematic diagram may be partially enlarged not according to a general scale, and the schematic diagram is only an example, and should not limit the protection scope of the disclosure herein.

The method begins at S601. As shown in FIG. 7A to FIG. 7C, a first chip 21 is provided. The first chip 21 includes the semiconductor structure described in any one of the above embodiments. Herein, the first chip 21 may be a memory array chip, and the memory array chip includes a memory cell array. The first chip may further include a circuit assembly. The circuit assembly may include, but is not limited to, a transistor, a resistor, a capacitor and an interconnection member, so as to form an IC integrated circuit.

In some embodiments, with reference to FIG. 7A, the operation that the first chip 21 is provided includes the following operation. A wafer is provided, in which the wafer includes a plurality of first chips 21.

In some embodiments, with reference to FIG. 7B, after the wafer is provided which includes the plurality of first chips 21, the method further includes the following operation. A non-active surface of the wafer is thinned. By thinning the wafer, an overall thickness of the wafer can be reduced, so that the integration can be further improved. Meanwhile, since the thickness of the wafer is thinned, the heat transfer path is shortened, so that the heat dissipation efficiency is further improved. In the actual operation, before the non-active surface of the wafer is thinned, the method further includes the following operation. A solidified layer is formed above the active surface of the wafer. A material of the solidified layer includes, but is not limited to, silicon dioxide, silicon nitride, polymeric materials, or a combination thereof. By providing the solidified layer, the active surface of the wafer can be prevented from being damaged during thinning.

In some embodiments, as shown in FIG. 7C, after the non-active surface of the wafer is thinned, the manufacturing method further includes the following operation. The wafer is cut, so as to separate the wafer from the plurality of first chips 21.

Next, S602 is performed, as shown in FIG. 7C, in which a wafer is provided, which includes a plurality of second chips 22. The second chip 22 may be a periphery chip. The periphery chip includes a peripheral circuit. The peripheral circuit may include any appropriate digital, analog and/or mixed-signal circuits that are used to facilitate the operation of the memory cell array. For example, the periphery chip may include one or more of a page buffer, a decoder (for example, a row decoder or a column decoder), a sense amplifier, a driver (for example, a word line driver), a charge pump, current or voltage references, or any active or passive component (for example, a transistor, a diode, a resistor or a capacitor) of the circuit. The second chip may further include a circuit assembly. The circuit assembly may include, but is not limited to, a transistor, a resistor, a capacitor and an interconnection member, so as to form an IC integrated circuit.

Next, as shown in FIG. 7C, S603 is performed, in which each of the plurality of first chips 21 is placed on a respective one of the plurality of second chips 22, in which an active surface 211 of each of the plurality of first chips is arranged face to face with an active surface 221 of the respective one of the plurality of second chips.

In some embodiments, a projection of each of the plurality of first chips 21 in a vertical direction is covered by a projection of the respective one of the plurality of second chips 22 in the vertical direction. Therefore, a space is reserved for the interconnection between the first chip 21 and the second chip 22 which are bonded to each other and other devices.

Finally, as shown in FIG. 7D, S604 is performed, in which the active surface 211 of each of the plurality of first chips is bumplessly bonded to the active surface 221 of the respective one of the plurality of second chips. Bumpless bonding may be, for example, hybrid bonding.

In some embodiments, as shown in FIG. 7E to FIG. 7H, the manufacturing method further includes the following operations. The wafer is cut to separate the wafer from each of the plurality of first chips 21 and the respective one of the plurality of second chips 22 which are bonded to each other. A plurality of base plates 23 are provided, in which a projection of each of the plurality of base plates 23 in the vertical direction covers the projection of the respective one of the plurality of second chips 22 in the vertical direction. Each of the plurality of first chips 21 and the respective one of the plurality of second chips 22 which are bonded to each other are placed on a respective one of the plurality of base plates 23. The respective one of the plurality of base plates 23 is bonded to the respective one of the plurality of second chips 22 through a lead wire 24.

Specifically, as shown in FIG. 7E, the wafer is firstly cut to separate the wafer from each of the plurality of first chips 21 and the respective one of the plurality of second chips 22 which are bonded to each other.

Next, as shown in FIG. 7F, a plurality of base plates 23 are provided. A projection of each base plate 23 in the vertical direction covers the projection of the respective second chip 22 in the vertical direction. Therefore, a space can be reserved for the interconnection between the base plate and the second chip 22. The base plate may be a Printed Circuit Board (PCB).

Figure 7G:
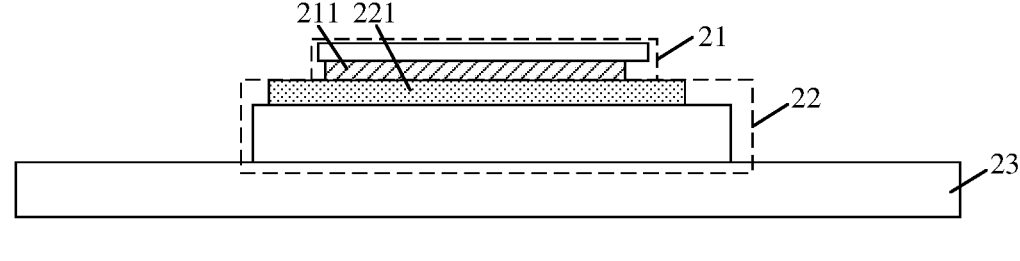

Then, as shown in FIG. 7G, each first chip 21 and the respective second chip 22 which are bonded to each other are placed on a respective one of the base plates 23.

Figure 7H:
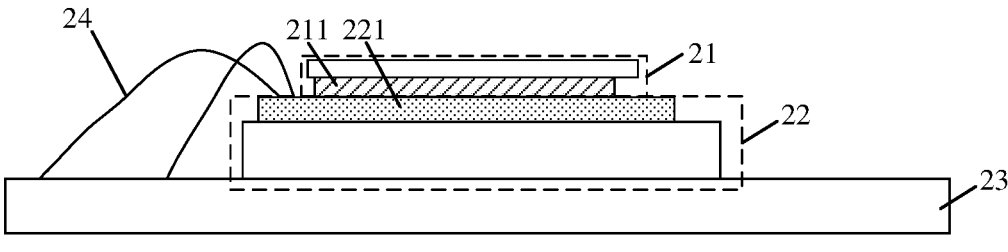

Finally, as shown in FIG. 7H, the respective one of the base plates 23 is bonded to the respective second chip 22 through the lead wire 24. Herein, one end of the lead wire may be arranged on the active surface of the second chip 22, and the other end of the lead wire may be arranged in a position where the projection of the base plate 23 in the vertical direction does not overlap with the projection of the second chip 22 in the vertical direction. In this way, electric connection and information communication between the first chip 21, the second chip 22 and the base plate can be achieved by bonding through the lead wire. The lead wire bonding process has the advantages of simple manufacturing process, low cost, low bonding temperature, high bonding strength and high efficiency.

Overall, the embodiment of the disclosure provides a semiconductor structure. The semiconductor structure includes: a substrate; a plurality of capacitors arranged in the substrate; and a plurality of active pillars arranged above the substrate. Each of the plurality of active pillars is arranged above a respective one of the plurality of capacitors, and a bottom portion of each of the plurality of active pillars is electrically connected to a top portion of the respective one of the plurality of capacitors therebelow. In the embodiments of the disclosure, each active pillar is arranged above the respective capacitor. That is to say, a transistor is arranged above the capacitor. In this way, the bit line electrically connected to the active pillar may be directly formed on the top portion of the active pillar, without the need for additional manufacture a contact and an interconnection line to lead out a bit line signal, so that the process is simplified. Further, since the bit line is directly formed on the top portion of the active pillar, that is, the bit line is formed on an active surface of a memory array chip, so that a Chip On Wafer (COW) process may be conveniently used later. With less interconnection lines and contacts, the memory array chip and the peripheral circuit wafer can be directly and bumplessly connected to each other in the vertical direction in a face-to-face manner. In this way, the space utilization is effectively improved, and the signal interconnection paths are reduced, thereby reducing the thermal resistance, and improving the signal transmission speed.

It should be noted that, the semiconductor structure, the method for manufacturing the semiconductor structure, the memory and the method for manufacturing the memory provided in the embodiments of the disclosure can be applied to any integrated circuit including these structures. The technical features in the technical solutions described in the embodiments may be arbitrarily combined with each other without conflict. Those skilled in the art can change the sequence of the operations in the above formation method without departing from the protection scope of the disclosure. Some operations in the embodiments of the disclosure may be simultaneously performed or may be sequentially perform without conflict.

The above only describes the preferred embodiments of the present disclosure, and is not intended to limit the protection scope of the present disclosure. Any modifications, equivalent substitution, improvements made within the spirit and principle of the present disclosure shall be contained within the protection scope of the present disclosure.

The invention claimed is:

1. A semiconductor structure, comprising: a substrate;
   a mask layer covering an upper surface of the substrate;
   a plurality of capacitors arranged in the substrate, each of a plurality of capacitors including a capacitor upper electrode, a capacitor dielectric layer and a capacitor lower electrode;
   a plurality of active pillars arranged above the substrate; and
   a contact, the contact and the plurality of active pillars being arranged on a same side of the substrate,
   wherein each of the plurality of active pillars is arranged above a respective one of the plurality of capacitors, and a bottom portion of each of the plurality of active pillars is electrically connected to the capacitor upper electrode, and a bottom portion of the contact is electrically connected to the capacitor lower electrode, and the capacitor lower electrode covers an upper surface of the mask layer, the contact passes through the capacitor lower electrode and the mask layer.

2. The semiconductor structure according to claim 1, further comprising:

a plurality of word lines extending in a first direction, wherein the plurality of word lines are arranged above the substrate, and each of the plurality of word lines is arranged around a sidewall of a respective one of the plurality of active pillars; and a plurality of bit lines extending in a second direction which intersects with the first direction, wherein the plurality of bit lines are arranged above the plurality of active pillars, and a bottom portion of each of the plurality of bit lines is electrically connected to top portions of the plurality of active pillars.

3. The semiconductor structure according to claim 2, further comprising:

a dielectric layer arranged above the substrate and covering the sidewalls of the plurality of active pillars;

a lower filling layer filled in gaps between any two adjacent active pillars of the plurality of active pillars below the plurality of word lines; and an upper filling layer filled in gaps between any two adjacent word lines of the plurality of word lines and gaps between any two adjacent active pillars of the plurality of active pillars above the plurality of word lines.

4. The semiconductor structure according to claim 3, wherein the contact penetrates through the upper filling layer and the lower filling layer.

5. The semiconductor structure according to claim 1, wherein a material of each of the plurality of active pillars comprises indium gallium zinc oxide.

6. A memory, comprising:

a first chip comprising the semiconductor structure according to claim 1; and a second chip comprising a peripheral circuit, wherein an active surface of the first chip is bumplessly bonded to an active surface of the second chip.

7. The memory according to claim 6, wherein the second chip is arranged below the first chip, and a projection of the second chip in a vertical direction covers a projection of the first chip in the vertical direction.

8. The memory according to claim 7, further comprises:

a base plate arranged below the second chip, wherein a projection of the base plate in the vertical direction covers the projection of the second chip in the vertical direction, and the base plate is bonded to the second chip through a lead wire.

\* \* \* \* \*